Dec. 10, 1968 R. L. SHEPARD 3,415,986
PROCESS FOR MASKING A PARA-XYLYLENE POLYMER AND SELECTIVELY ETCHING IT BY A GASEOUS ELECTRICAL GLOW DISCHARGE
Filed June 25, 1965
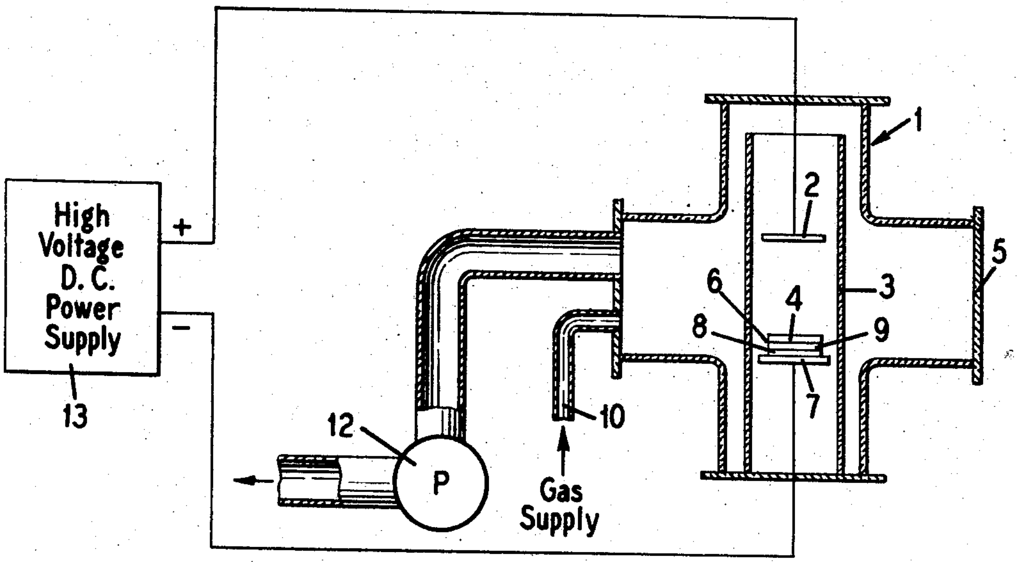
INVENTOR
ROBERT L. SHEPARD
BY Lawrence G. Kastriner
ATTORNEY United States Patent Office 3,415,986

Patented Dec. 10, 1968

3,415,986

PROCESS FOR MASKING A PARA-XYLYLENE POLYMER AND SELECTIVELY ETCHING IT BY A GASEOUS ELECTRICAL GLOW DISCHARGE

Robert L. Shepard, Cleveland Heights, Ohio, assignor to Union Carbide Corporation, a corporation of New York Filed June 25, 1965, Ser. No. 467,072

14 Claims. (Cl. 250—49.5)

This invention relates to a process for etching films of para-xylylene polymers in general and poly para-xylylene in particular by gaseous electrical glow discharge. This process is particularly useful in the manufacture of electronic devices such as, for example, field effect transistors.

In the fabrication of electronic devices such as field effect transistors a base semiconductive material of a given conductivity type is used. In order to produce distinct regions of opposite conductivity type within the semiconductor material, impurities are diffused into its surface. For example, if a N type silicon crystal is used as the semiconductor material, distinct regions characterized as P type may be created by diffusing boron into the silicon. Between any two of such properly spaced P type regions will be a zone characterized as N type. In field effect transistors such a zone is known as a channel. Overlying the channel is a thin layer or film of dielectric material deposited on which is a metallic electrode known as a gate. Connecting any two of the aforementioned P type regions in an electrical circuit and connecting the gate to a power source completes a typical field effect transistor. In operation, the gate controls the current flow between the two regions by subjecting the current carriers in the channel to an electric field. For example, with a channel of N type conductivity which separates two regions of P type conductivity; by making the gate electrode negative with respect to the channel, the electric field attracts P type carriers into the channel thus changing its characteristic from N to P type and thereby allowing current to flow. The more negative the electric field, the more P type carriers are attracted into the channel and the more current that can flow between the two regions.

The insulating film or dielectric is of singular importance in the operation of field effect transistors. It is desirable to have a thin insulating film with a high dielectric constant; for the thinner the film and the higher its dielectric constant, the greater the induced carrier concentration in the channel for a given impressed voltage on the gate. In addition it is desirable to have a dielectric with a high breakdown voltage in order that it act as an insulator and not as a conductor at relatively high voltages. Consonant with these considerations the prior art has used dielectric films of silicon dioxide and silicon monoxide. However, these films are not entirely satisfactory because they often contain pinholes which act as conductors between the gate and the semiconductor material thus destroying the insulation effect desired. Moreover, such films have proven to be the source of impurities which diffuse into the channel changing its electrical characteristics. In addition pin hole free films of silicon dioxide or silicon monoxide less than 800 angstroms in thickness are difficult to achieve. Typically, depending on the particular application, the thickness of dielectric insulating material should range from 200 angstroms to about 2,000 angstroms.

To overcome the deficiencies in silicon dioxide and silicon monoxide, thin organic films are being used for the insulating material. Of the most promising of these films are para-xylylene polymers of which the poly para-xylylene is normally preferred. These films are discussed in detail in copending application Ser. No. 435,124, filed Feb. 25, 1965, which is now U.S. Patent No. 3,375,419. The advantages of such films include satisfactory dielectric constants and breakdown voltage at thicknesses ranging from less than 100 angstroms to 10,000 angstroms or more in pinhole-free constant thickness films. Additionally, these films have a dielectric constant and dissipation factor which are relatively constant over a wide frequency range and a linear capacitance-voltage characteristic.

In addition to the desired characteristics of the insulating film or dielectric discussed above, proper coating of the film on the base semiconductor substrate, without deleteriously affecting the substrate, is very important in the successful manufacture of electronic devices. One consideration is the degree of geometric resolution and dimensional stability of the insulating film, for the area as well as the thickness of dielectric directly affect performance. Because of the film will not cover the entire substrate in the finished product, means must be employed to manufacture devices with only desired areas covered by the film. To this end, insulating films have been deposited heretofore on the desired areas of the substrate directly through openings in a mask. Alternately, the insulating film has been deposited over the entire substrate and a coating of solvent resistant material is placed over the entire film. The solvent resistant material may be either the "positive" or "negative" photoresist type. For the case of positive photoresist type, the solvent resistant material is then masked to protect it at the desired areas. Whereupon the solvent resistant material is degraded by, for example, light and the so degraded material and film are removed by suitable solvents. The remaining solvent resistant material is then removed to yield a substrate covered only in desired areas by the insulating film.

However, these prior art techniques for fabricating insulating films are not satisfactory for films of para-xylylene polymers. Depositing para-xylylene polymers through the openings in masks onto a substrate is impractical because these materials creep under the mask thereby enlarging the deposited area. This enlargement usually exceeds 0.001 inch in linear dimension thereby destroying the high degree of geometric resolution required in electronic applications. In addition, the aforementioned films will deposit on the mask as well as on the substrate. Owing to the nature of the film, when the mask is removed, it takes with it the material deposited on the substrate. Masking by solvent resisting materials is similarly impractical. There is no known practical etching solvent which will satisfactorily remove a film of para-xylylene polymer which would not also remove the solvent resistant material. Notwithstanding the aforementioned problems, it is difficult to control the depth of etching with prior art techniques when only partial removal of selected areas of the film is desired.

It is, therefore, the primary object of this invention to provide an economical and practical process for the selective removal of films of para-xylylene polymers.

It is another object of the present invention to provide an economical and practical process for the selective removal of films of para-xylylene polymers which have been deposited on a substrate without deleteriously affecting the substrate.

It is yet another object of the present invention to provide an economical and practical process for the selective removal of films of para-xylylene polymers which have been deposited on a substrate of semiconductor material which will effect very fine geometric resolution in the as-etched product.

It is still another object of the present invention to provide an economical and practical process whereby selected areas of thin films of para-xylylene polymer can be controllably removed in order that a film of desired thickness is obtained.

These and other objects and advantages will become more apparent from the following description, drawing, and appended claims.

According to the present invention, at least a portion of the thickness of a selected area of thin film of para-xylylene polymer which has been deposited on a substrate is removed by masking the surface of the film such that only the selected area is exposed, and then removing at least a portion of the thickness of the selected area of the thin film by means of a low pressure gaseous electrical glow discharge.

The theory of gaseous electrical glow discharge etching, hereinafter referred to as glow discharge etching, is not well understood. However, a tentative hypothesis of the physical phenomena involved is as follows. An electric field impressed between two spaced apart electrodes in a gas at a reduced pressure causes the acceleration of naturally ionized gas molecules towards one of the electrodes. Some of these ionized molecules collide with unionized gas molecules with sufficient energy to create additional ions and free electrons. The additional ions are accelerated by the field and collide with other molecules to generate still more ions and electrons. The free electrons are accelerated towards the anode and may also create additional ions by collision with gas molecules. The process of generating ever increasing numbers of ions continues until a field-ion concentration equilibrium is attained. When films of paraxylylene polymer are disposed on the cathode of such a system and are exposed to the bombardment of the ionized gas molecules of sufficient energy to break the chemical bonds forming the polymer film, the molecules of the degraded film either evaporate or are knocked off into the surrounding vacuum enclosure by the ionized gas molecules.

Apparatus for practicing the process of this invention is well known in the art. A specific embodiment thereof is herein described for the purpose of illustration with reference to the drawing in which:

The figure is a schematic drawing of the apparatus which is preferably used in the practice of the process of the invention.

Referring to the drawing, the apparatus comprises a cross shaped vacuum enclosure constructed of glass containing two parallel spaced apart electrodes 2 and 7 which are at the center of the vacuum enclosure and connected in circuit to a high voltage power supply 13. A glass or quartz cylindrical shield 3 is positioned within the enclosure to confine the glow discharge to the region between the two electrodes 2 and 7. A vacuum pump 12 and gas supply means 10 communicate with the interior of the vacuum enclosure 1. A removable plate 5 is also provided in the wall of the enclosure for the introduction and removal of the sample 6 which comprises a substrate 8 and a film 9.

The power supply 13 is preferably adjustable and capable of supplying a voltage drop of up to 1000 volts or more across the electrode gap. Preferably, the power supply is of the high reactance type or has connected in series with the high voltage electrode (anode) 2 a resistor of about 25,000 ohms to stabilize the electric discharge across the electrodes. Direct current is preferred, but alternating current can be used at the expense of slowing down the rate of etching.

The electrodes 2 and 7 can be made of any suitable material normally used for electrodes. Preferably, however, the anode 2 is fabricated from a low "sputtering" material such as aluminum. This is necessary to substantially eliminate deposition of anode material on the film 9 to be etched. The minimum linear surface dimension of the anode should be at least twice that of the maximum linear surface dimension of the film to be etched in order that a uniform etching rate is effected. For optimum performance with the apparatus described, the electrode gap should be between 2 and 6 centimeters. In any event the gap between the electrodes must be sufficient to avoid placing the anode within the cathode dark space. The cathode dark space thickness is about one centimeter at 100 microns pressure and varies with pressure, becoming thinner as the pressure is increased and thicker as the pressure decreases.

A vacuum pump 12 communicates with the interior of the enclosure and is capable of creating an ultimate vacuum therein on the order of $2\times10^{-6}$ torr. This vacuum purges the environment surrounding the specimen before the etching process has begun of as much air and moisture as is practical. This purge is helpful in obtaining predictable etching rates inasmuch as varying the composition of the gas in the enclosure during the etching process results in differing etching rates. Moreover, the avoidance of oxidation of the film from gases in the etching environment tends to make the results more predictable. After the etching process is completed, it is preferred to evacuate the interior of enclosure 1 to a pressure considerably below that present during etching in order to assure complete evaporation of the degraded portions of the film. During the actual etching process the pressure is supplied by argon or other gases admitted to the enclosure by gas supply 10 and should be maintained at between about 50 microns ($50\times10^{-3}$ torr) and about 300 microns. A pressure of about 150 microns is preferred. When the pressure is below 50 microns, the glow discharge becomes unstable; the instability being tentatively attributed to the relatively infrequent electron and ion-molecule collisions at such pressure. Above 300 microns pressure, the glow discharge once again becomes unstable. It is postulated that this instability is incident to the relatively low mean free path of the accelerated ions and electrons which is less than the distance between electrodes thereby causing the glow discharge to degenerate to localized arcing within the vacuum enclosure.

As stated above, gas is supplied by gas supply means 10 to the vacuum enclosure 1 to provide a source of ionized molecules to bombard and remove the film in the desired areas. The choice of gas is not critical to the etching process and nitrogen, argon or even oxygen can be used. In preferred practice an inert gas such as argon is employed in order to avoid chemical reaction between the gas and the film or the underlying material. If a chemically reactive gas were used the predictability of etching rate would be more difficult and there would be a chance of altering the composition of the film remaining after the etching process is complete. However, chemically reactive gases may accelerate the etching rate and therefore may be desirable in certain circumstances.

There are two preferred methods of masking the thin films of para-xylylene polymers. The first mode uses a stiff perforated metal plate or mask 4. While the mask need not be metal, it should at least be composed of an electrically conductive material such as graphite or titanium dibromide. This mask is prepared such that its perforations conform to the geometric pattern which is to be etched, that is, the selected areas of the film 9 to be removed will correspond to the perforations in the mask. In preferred practice, a fixture receives both the film coated substrate or Sample 6 and mask 4 and urges the mask firmly against the film 9. The urging assures that only those areas of the film 9 which are exposed through the perforations will be removed. Either the mask 4 or the fixture (not shown) is grounded to the cathole by physical contact or wire and thus becomes a part of the cathole.

An alternate mode of masking is to vacuum deposit a material, for example aluminum, onto the film through a perforated mask. The deposited material will act to mask the areas of the film which it overlies. After etching the exposed film with the glow discharge, the material is removed by an acid which attacks the material but not the underlying film. In many applications, however, the removal of the material is not necessary in that it can be used as connectors for electronic devices. For example, with a field effect transistor, the material retained over the film could be a metal and become the gate electrode.

The masking of the films either by a perforated metal mask or evaporated metal allows a multiplicity of electronic devices to be fabricated from one film covered substrate. In field effect transistors, for example, several regions of opposite conductivity type separated by a channel for each pair of such regions can be fabricated on a single piece of semiconductor material by means well known in the art. The film of para-xylylene polymer is then deposited onto the entire substrate. A perforated metal mask is then placed over the film with its perforations oriented where etching is desired; that is, substantially everywhere except the channels. The exposed film is then etched by glow discharge leaving film only over the channels. The regions of opposite conductivity and the channel are then separately covered with a metal to provide electric contacts. Alternately, metal can be deposited on the regions of the film covered substrate which are to be the channels. The entire substrate is then etched by glow discharge to remove all the film save that protected by the deposited metal. The regions of opposite conductivity are then separately covered with metallic contacts. Electrical connections are then secured to these metallic contacts and the deposited metal; the latter becoming the gate in field effect transistors.

It has been found that extremely fine etch delineation is obtained with either of the masking techniques enumerated, and that a mask with small rectangular holes measuring 0.004 inch by 0.010 inch can be used to produce an etch of substantially the same dimension, namely 0.010±0.0003 inch by 0.004±0.0003 inch. Moreover, etching of para-xylylene polymers by a glow discharge is all that is required to remove the areas of unwanted film. In all other prior art techniques a subsequent solvent treatment step is required to remove the material inasmuch as it is only weakened and not removed. This additional step increases the chance for contamination of the substrate or the film.

It has also been found that the time required to etch a given thickness of film is proportional to its thickness. Increasing the temperature of the environment in which the film is being etched decreases the time required to etch a given thickness of material. At room temperature approximately 2 minutes are required to etch each 1000 angstroms of thickness of film under conditions heretofore described.

The para-xylylene polymer films which are etched by the process of this invention are obtained and applied to a substrate through condensation of vaporous diradicals having the structure:

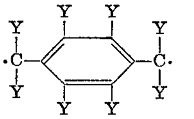

in which Y can represent any inert monovalent group, as hereinafter more fully described. These p-xylene diradicals are stable in the vaporous state at temperatures above 200–250° C. but will condense into a thin void-free film of a solid linear polymer, termed herein para-xylylene polymer which can be characterized by the repeating structure:

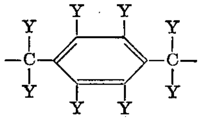

When the Y groups are all hydrogen, the polymer is termed poly (p-xylylene) which is a preferred material for most electronic applications, for example, as the dielectric insulating material in a field effect transistor.

Each different diradical tends to have its separate condensation temperature generally ranging from about 25° C. to about 250° C. or slightly above depending to a degree on the ambient pressure of the system.

The above mentioned p-xylylene diradicals can be made by any of several techniques. The method found most convenient and preferred is by the pyrolysis at temperatures between about 40° C. and about 700° C. of at least one cyclic dimer represented by the structure:

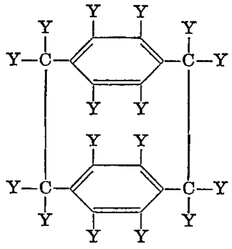

wherein Y is any monovalent inert substituent group, preferably hydrogen or halogen although on the aromatic nucleus, it can be any inert substituent group when starting with this dimer. The Y substituents on the alpha carbon atoms should be non-polar for best performance as an insulating material. On pyrolysis, the dimer cleaves into two separate reactive vaporous diradicals each having the structure:

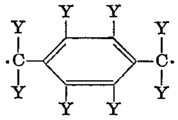

Thus, where all the Y groups are hydrogen, or where the nuclear substituent on each diradical is the same, two moles of the same p-xylylene diradical are formed, and when condensed yield a substituted or unsubstituted p-xylylene homopolymer. When the aromatic nuclear substituent Y groups on each diradical are different or where they are the same but are present on the diradical species in different amounts, two different diradicals are formed, condensation of which will yield copolymers as hereinafter set forth.

Alpha substituted p-xylylene diradicals, as for example the alpha-halogen substituted compounds, are also prepared by the pyrolysis of an aryl bis-sulfone of the structure:

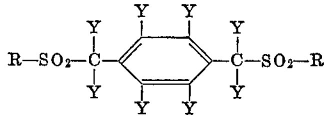

where R is a lower hydrocarbon group, and Y is defined as above. The Y substituents on the alpha carbon atoms should be nonpolar as well as inert. These sulfones pyrolyze on heating to temperatures of about 600° C.–1000° C. into sulfur dioxide and the reactive diradical.

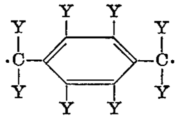

This technique is particularly desirable for introducing alpha halo substituent groups in the polymer. Outstanding among such polymers is the highly thermally stable poly (α,α,α′,α′,-tetrafluoro-p-xylylene).

Reactive diradicals are also prepared by the pyrolysis of a diaryl sulfone of the structure:

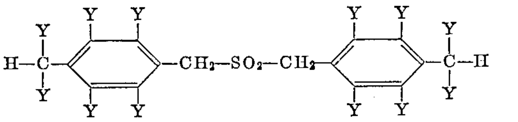

wherein Y is defined as above. The Y substituents on the alpha carbon atoms should be non-polar. These sulfones pyrolyze on heating to temperatures of about 400° C.–800° C. into sulfur dioxide and 2 moles of monoradical of the formula:

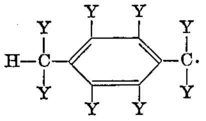

which disproportionates into a p-xylylene and a diradical of structure:

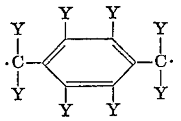

Any other technique of making the vaporous diradicals can of course be used. Since the pyrolysis of the cyclic dimer di-p-xylylene involves no other by-products and the dimer cleaves quantitatively into two moles of the reactive diradical, this method is most preferred.

Inasmuch as the coupling and polymerization of these reactive diradicals upon the condensation of the diradicals does not involve the aromatic ring, any unsubstituted or desired substituted p-xylylene polymer can be prepared since the substituent groups function essentially as an inert group. Thus, the substituent Y-group can be any organic or inorganic group which can normally be substituted on an aromatic nucleus or on the aliphatic α carbon atoms of such a diradical.

Notable among the monovalent inert groups that have been placed on the aromatic nuclei or aliphatic α carbon atoms of such para-xylylene polymers other than hydrogen are the halogens including chlorine, bromine, iodine and fluorine, alkyl groups such as methyl, ethyl, propyl, butyl and hexyl, cyano, phenyl, amine, nitro, carboxyl, benzyl and other similar groups. While some of the above groups are potentially reactive in certain conditions or with certain reactive materials, they are unreactive under the conditions of the present invention and hence are truly inert in the instant case.

It may also be evident that certain physical attributes of specific para-xylylene polymers may be so desirable that their dielectric properties, sometimes inferior to that of poly (p-xylylene), may be acceptable or tolerated. Poly (2-chloro-p-xylylene) for example, is a very tough polymer having certain mechanical benefits over other para-xylylene polymers. Also poly (α,α,α′,α′, tetra-fluoro-p-xylylene) is highly temperature resistant and can even tolerate exposure of 300° C. for 100 hours without any change in physical strength. Of the substituted para-xylylene polymers these two are preferred. Normally, however, the unsubstituted poly (p-xylylene) is preferred for use in the present invention, i.e. where all Y substituents on the polymer are hydrogen, as the polymer made from it possesses the most stable electrical properties and the most desirable dielectric constant of all these polymers.

The substituted di-p-xylylenes and the aryl sulfones from which these reactive diradicals are prepared, can be prepared by techniques commonly known to most organic chemists. For example, the cyclic dimer, di-p-xylylene, is readily susceptible to halogenation, alkylation and/or oxidation and reduction techniques and like methods of introduction of such substituent groups into aromatic nuclei. Inasmuch as the cyclic dimer is a very stable product up to temperatures of about 400° C., elevated temperature reactions can also be employed for the preparation of various substituted materials. As used herein the term "di-p-xylylene" refers to any substituted or unsubstituted cyclic di-p-xylylene as hereinabove discussed, and the term "p-xylylene diradical" refers to any substituted or unsubstituted p-xylylene structure having a free radical or free valence electron on each alpha carbon atom as hereinabove discussed.

In the polymerization process, the vaporous diradicals condense and polymerize nearly instantaneously at the condensation temperature of the diradicals. The coupling of these diradicals involves such low activation energy and the chain propagation shows little or no preference as to the particular diradical, so that steric and electronic effects are not important as they are in vinyl polymerization for example. The substituted and/or unsubstituted p-xylylene homopolymers can be made by cooling the vaporous diradical down to any temperature below the condensation temperature of the diradical. It has been observed that for each diradical species, there is a definite ceiling condensation temperature above which the diradical essentially will not condense and polymerize. All observed ceilings of substituted p-xylylene diradicals have been below about 200° C. but vary to some degree upon the operating pressure involved. For example, at 0.5 mm. Hg pressure, the optimum condensation and polymerization temperatures observed for the following diradicals are:

| | ° C. |
|---|---|
| p-Xylylene | 25–30 |
| Chloro-p-xylylene | 70–80 |
| n-Butyl-p-xylylene | 130–140 |
| Iodo-p-xylylene | 180–200 |
| Dichloro-p-xylylene | 200–250 |
| α,α,α′,α′-Tetrafluoro-p-xylylene | 35–40 |

Thus, by this process, homopolymer dielectric films are made by maintaining the substrate surface at a temperature below the ceiling condensation temperature of the particular diradical specie involved, or desired in the homo-polymer. This is most appropriately termed "homopolymerizing conditions."

Where several different diradicals existing in the pyrolyzed mixture have different vapor pressure and condensation characteristics, as for example, p-xylylene and chloro-p-xylylene and dichloro-p-xylylene or any other mixture with other substituted diradicals, homopolymerization will result when the condensation and polymerization temperature is selected to be at or below that temperature where only one of the diradicals condense and polymerize. Thus, for purposes within this application, the terms "under homopolymerization conditions" are intended to include those conditions where only homopolymers from a mixture containing one or more of the substituted diradicals when any other diradicals present have different condensation or vapor pressure characteristics, and wherein only one diradical specie is condensed and polymerized on the substrate surface. Of course, other diradical species not condensed on the substrate surface can be drawn through the deposition apparatus in vaporous form to be condensed and polymerized in a subsequent cold trap.

Inasmuch as unsubstituted p-xylylene diradicals, for example are condensed at temperatures about 25° C. to 30° C., which is much lower than chloro-p-xylylene diradicals, i.e., about 70° C. to 80° C., it is possible to have present such diradicals in the vaporous pyrolyzed mixture along with the chlorine-substituted diradicals. In such a case, homopolymerizing conditions are secured by maintaining the substrate surface at a temperature below the ceiling condensation temperature of the substituted p-xylylene but above that of the p-xylylene, thus permitting the p-xylylene vapors to pass through the apparatus without condensing and polymerizing but collecting the poly-p-xylylene in a subsequent cold trap.

It is also possible to obtain substituted copolymers through the pyrolysis process hereinabove described. Copolymers of p-xylylene and substituted p-xylylene diradicals, as well as copolymers of different substituted p-xylylene diradicals wherein the substituted groups are all the same but each diradical containing a differing number of substitutent groups can all be obtained through said pyrolysis process.

Copolymerization occurs simultaneously with condensation upon cooling of the vaporous mixture of reactive diradicals to a temperature below 200° C. under polymerization conditions.

Copolymers can be made by maintaining the substrate surface at a temperature below the ceiling condensation temperature of the lowest boiling diradical desired in the copolymer, such as at room temperature or below. This is considered "copolymerizing conditions," since at least two of the diradicals will condense and copolymerize in a random copolymer at such temperature.

In the pyrolytic process of di-p-xylylene the reactive diradicals are prepared by pyrolyzing the substituted and/or unsubstituted di-para-xylylene at a temperature between about 400° C. and about 700° C., and preferably at a temperature between about 550° C. to about 600° C. At such temperatures, essentially quantitative yields of the reactive diradical are secured. Pyrolysis of the starting di-p-xylylene begins at about 400° C.–500° C. but such temperatures serve only to increase time of reaction and lessen the yield of polymer secured. At temperatures above about 700° C., cleavage of the substitutent group can occur, resulting in a tri- or polyfunctional species causing cross-linking and highly branched polymers.

Pyrolysis temperature is essentially independent of the operating pressure. For mose operations, pressures within the range of 0.01 micron to 10 mm. Hg are most practical for pyrolysis. Likewise if desirable, inert vaporous diluents such as nitrogen, argon, carbon dioxide, helium and the like can be employed to vary the optimum temperature of operation or to change the total effective pressure in the system.

A useful apparatus for generating a highly directional stream of vaporous p-xylylene diradicals comprises a container open at one end, surrounded by a heating means. The open end of the container communicates by means of a vapor tight seal through an orifice with an elongated cylindrical tube. The tube is surrounded for at least a portion of its length by a heating means which in turn is surrounded by a radiation heat shield. The solid dimer is heated in the container to a temperature above about 150° C. to form the dimer vapor. The vapor is heated further in the tube to a cleavage temperature of about 400 to 700° C., preferably about 600° C. The outlet end of the vapor tube has a nozzle for discharging diradical vapors into a vacuum deposition chamber, where the substrate is supported and held at a temperature of from about −40° C. to about 50° C.

The following examples are illustrative of specific applications of my invention and should not be construed as limitations thereof.

EXAMPLE I

A sample comprising a thin film of poly-para-xylylene of about 1000 angstroms thickness deposited on a thin disc of silicon measuring about one inch in diameter was placed in a metal fixture which urged the film of poly-para-xylylene firmly against a stiff perforated metal mask or plate by means of spring pressure. The perforations in the metal mask corresponded to the regions on the poly-para-xylylene which were to be removed from the silicon substrate.

The specimen together with its metal mask and fixture was placed on a cathode within a vacuum enclosure and oriented such that the metal mask and exposed poly-para-xylylene faced an anode. The mask was connected electrically to the cathode. The anode had lateral dimensions approximately twice that of the region to be etched, and was composed of aluminum. The distance between the mask and the anode was 4 centimeters. A glass shield was placed around the sample and anode and extended well beyond the region between them in order to confine the glow discharge to between the electrodes.

The vacuum enclosure was then evacuated to a pressure of about $2\times10^{-6}$ torr in order to purge as much air and moisture from its interior as possible. Proper etching environment within the enclosure was then created by the introduction of argon gas and control of the vacuum to about 150 microns pressure.

An external power source which was in circuit with the electrodes was then actuated. The voltage between the electrodes was increased until it reached a value of 1000 volts at about 100 milliamperes current at which point a well defined gaseous electric glow discharge had been established and etching had begun.

The etching of the poly-para-xylylene film was completed in about two minutes whereupon the power supply was turned off in order to avoid damage to the substrate. The vacuum enclosure was then pumped down to a pressure of about $2\times10^{-6}$ torr in order to insure that all of the degraded material was evaporated from the substrate. The enclosure was then brought up to atmospheric pressure with argon and the specimen removed.

EXAMPLE II

A film of poly-para-xylylene approximately 1000 angstroms thick was deposited on an aluminum substrate to form a sample. A 0.001 inch thick metal mask having a plurality of rectangular perforations each measuring 0.004 inch by 0.015 inch and each of such perforations separated by 0.005 inch of metal was placed firmly over the poly-para-xylylene film. The sample and mask were placed on a cathode within a vacuum enclosure. Electrical communication existed between the mask and the cathode. The mask faced an anode. The glow discharge etching was carried out in a nitrogen atmosphere at a pressure of 200 microns. A 400 volt D.C. potential was applied between the mask and the anode at 50 milliamperes current. The etching time was two minutes. The poly-para-xylylene film was completely removed in the areas coterminous with the perforations leaving unaffected the film protected by the metal mask.

EXAMPLE III

A sample was prepared as indicated heretofore. Aluminum of a thickness of 2500 angstroms was deposited over certain areas of the poly-para-xylylene film. The sample and its mask of deposited aluminum was subjected to glow discharge under conditions substantially similar to Example II. The film was removed where it was not protected by the deposited aluminum leaving the surface of the substrate bare except in the areas protected by the overlying aluminum.

EXAMPLE IV

Under conditions substantially as given in the preceding examples except where specifically noted; a sample of 8000 angstrom thick poly-para-xylylene deposited on aluminum foil was partially masked to protect a portion of the film. The sample was attached to the cathode and subjected to a glow discharge in a nitrogen atmosphere at 100 microns pressure with a 500 volt potential across the electrodes at 1 milliampere current for 15 minutes. The film was completely etched away in the areas unprotected by the mask.

While the process constituting this invention has been discussed with specific reference to a preferred apparatus and in connection with field effect transistors, it should be understood that the invention can be practiced within the scope and spirit of the appended claims for other applications. For example, in the fabrication of insulating films in thin film capacitors.

What is claimed is:

1. A process for removing at least a portion of the thickness of a selected area of a thin film of paraxylylene polymer which has been deposited on a substrate comprising the steps of:

(a) masking the surface of a thin film of paraxylylene polymer by depositing on portions of the polymer film a coating of a material more resistant to glow discharge etching than the polymer film such that only a selected area of the thin film is exposed to a gaseous electrical glow discharge; and then (b) removing at least a portion of the thickness of the selected area by subjecting the exposed film to the gaseous electrical glow discharge.

2. The process claimed in claim 1 wherein the para-xylylene polymer is poly para-xylylene.

3. The process claimed in claim 1 wherein the para-xylylene polymer is dichloro para-xylylene.

4. The process claimed in claim 1 wherein the para-xylylene polymer is chloro para-xylylene.

5. The process claimed in claim 1 wherein at least some of the masking material is removed from the coated portions of the surface of the polymer film after the selected exposed areas of the polymer film are removed by glow discharge etching.

6. The process claimed in claim 1 wherein the surface of the film is masked by vapor depositing aluminum metal on the surface such that only the selected area of the polymer film not covered by the aluminum coating is exposed to the gaseous electrical glow discharge.

7. The process claimed in claim 6 wherein the para-xylylene polymer is poly para-xylylene.

8. A process for removing at least a portion of the thickness of a selected area of a thin film of para-xylylene polymer which has been deposited on a substrate comprising the steps of:

(a) masking the surface of a thin film of para-xylylene polymer which has been deposited on a substrate by vapor depositing a metallic coating on portions of the surface of the polymer film to form a mask such that only a selected area of the film is exposed to a gaseous electrical glow discharge;

(b) placing the masked film and substrate within a vacuum enclosure, having disposed therein a cathode and an anode, on the cathode with the mask in electrical communication with the cathode, and with the selected area facing the anode, the anode and cathode being spaced apart such that the anode is outside of a cathode dark space generated around the cathode, and the cathode and the anode being connected in series to an electrical power source;

(c) introducing a gas into the interior of the vacuum enclosure;

(d) maintaining the pressure within the vaccum enclosure at from about 50 to about 300 microns; and (e) establishing a gaseous electrical glow discharge between the anode and cathode by the introduction of electrical energy from the electric power source, whereby the selected area of the thin film is at least partially removed.

9. The process claimed in claim 8 wherein the para-xylylene polymer is poly para-xylylene.

10. The process claimed in claim 8 wherein the para-xylylene polymer is dichloro para-xylylene.

11. The process claimed in claim 8 wherein the para-xylylene polymer is chloro para-xylylene.

12. The process claimed in claim 8 wherein the surface of the film is masked by vapor depositing aluminum metal on the surface such that only the selected area of the polymer film not covered by the aluminum coating is exposed to the gaseous electrical glow discharge.

13. The process claimed in claim 12 wherein the para-xylylene polymer is poly para-xylylene.

14. The process claimed in claim 12 wherein at least some of the aluminum is removed from the coated portions of the surface of the polymer film after the selected exposed areas of the polymer film are removed by glow discharge etching.

References Cited

UNITED STATES PATENTS 3,321,768 5/1967 Byrd -------------- 250—49.5

FOREIGN PATENTS 1,327,939 4/1963 France.

OTHER REFERENCES

Advances in Vacuum Science And Technology, Holland, Pergamon Press (1960), pp. 753–759.

ARCHIE R. BORCHELT, *Primary Examiner.*

A. L. BIRCH, *Assistant Examiner.*

U.S. Cl. X.R.

204—165; 264—22; 156—2